United States Patent [19]
Carey et al.

[11] Patent Number: 5,994,174
[45] Date of Patent: *Nov. 30, 1999

[54] METHOD OF FABRICATION OF DISPLAY PIXELS DRIVEN BY SILICON THIN FILM TRANSISTORS

[75] Inventors: Paul G. Carey, Mountain View; Patrick M. Smith, San Ramon, both of Calif.

[73] Assignee: The Regents of the University of California, Oakland, Calif.

[*] Notice: This patent is subject to a terminal disclaimer.

[21] Appl. No.: 08/940,104

[22] Filed: Sep. 29, 1997

[51] Int. Cl.$^6$ .................................................. H01L 21/268
[52] U.S. Cl. ........................... 438/166; 438/30; 438/487; 438/535; 257/66; 257/70; 257/72; 345/55; 345/87; 345/90; 345/92
[58] Field of Search .............................. 438/30, 166, 308, 438/487, 535; 257/66, 70, 72; 345/55, 87, 90, 92

[56] References Cited

U.S. PATENT DOCUMENTS 5,614,730  3/1997  Nakazawa et al. .

Primary Examiner—Charles Bowers
Assistant Examiner—Keith Christianson
Attorney, Agent, or Firm—L. E. Carnahan

[57] ABSTRACT

Display pixels driven by silicon thin film transistors are fabricated on plastic substrates for use in active matrix displays, such as flat panel displays. The process for forming the pixels involves a prior method for forming individual silicon thin film transistors on low-temperature plastic substrates. Low-temperature substrates are generally considered as being incapable of withstanding sustained processing temperatures greater than about 200° C. The pixel formation process results in a complete pixel and active matrix pixel array. A pixel (or picture element) in an active matrix display consists of a silicon thin film transistor (TFT) and a large electrode, which may control a liquid crystal light valve, an emissive material (such as a light emitting diode or LED), or some other light emitting or attenuating material. The pixels can be connected in arrays wherein rows of pixels contain common gate electrodes and columns of pixels contain common drain electrodes. The source electrode of each pixel TFT is connected to its pixel electrode, and is electrically isolated from every other circuit element in the pixel array.

8 Claims, 6 Drawing Sheets

METHOD OF FABRICATION OF DISPLAY PIXELS DRIVEN BY SILICON THIN FILM TRANSISTORS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to active matrix displays, particularly to the formation of pixels for such displays, and more particularly, to a method for the formation of display pixels driven by silicon thin film transistors on plastic substrates.

In recent years substantial effort has been directed to the development of large area low cost electronics, such as flat panel displays, as well as portable electronics, and toys. Also, active matrix displays are being utilized in battlefield operations facilities, interior of ships, tanks and aircraft, as well as field-deployable portable electronics.

Conventional processing techniques used to fabricate active matrix liquid crystal displays (AMLCDs), for example, require processing temperatures of at least 300–350° C. and as high as 600–650° C. These high processing temperatures require that quartz or glass substrates be used for the active matrix pixel array, thereby eliminating the use of less expensive substrates such as various types of plastics. Recently, low-temperature processes have been developed to fabricate silicon thin film transistors (TFTs) on low-temperature plastic substrate materials, using substrates being incapable of withstanding processing temperatures greater than about 200° C. These prior low-temperature processes are exemplified by copending U.S. application Ser. No. 08/611,318 filed Mar. 5, 1996, entitled "Method For Formation Of Thin Film Transistors On Plastic Substrates", assigned to the same assignee, and incorporated herein by reference thereto.

The present invention involves display pixels driven by silicon thin film transistors on low-temperature plastic substrates and a method for fabricating same. The method of this invention allows the fabrication of transistors on low-temperature plastic substrate materials, such as polyethyleneterephthalate (PET), which cannot withstand process temperatures in excess of 120° C. The process of the present invention involves the integration of the low temperature silicon TFT process with the necessary operational steps to produce: 1) a pixel circuit containing the TFT and an optical element; and 2) an entire array of pixels.

SUMMARY OF THE INVENTION

It is an object of the present invention to provide display pixels driven by silicon thin film transistors.

A further object of the invention is to provide a method for fabrication of display pixels driven by silicon thin film transistors.

A further object of the invention is to provide a method for fabricating pixels driven by silicon thin film transistors on low-temperature substrates.

A further object of the invention is to provide pixels driven by silicon thin film transistors fabricated on plastic substrates for use in active matrix displays.

Another object of the invention is to provide a method for fabricating display pixels which utilizes a prior method for fabricating individual silicon thin film transistors for driving the pixels.

Another object of the invention is to provide a method which integrates a low temperature process for fabricating silicon thin film transistors with operational steps to produce: 1) a pixel circuit containing a thin film transistor and an optical element, and 2) an entire array of pixels.

Another object of the invention is to provide a pixel circuit which can be arranged into an array of pixels of arbitrary number and size for controlling optically relevant materials to form an active display.

Another object of the invention is to provide an array of pixels each driven by at least one thin film transistor which can be connected such that rows of pixels contain common gate electrodes and/or columns of pixels containing common drain electrodes.

Other objects and advantages of the present invention will become apparent from the following description and accompanying drawings. The invention involves the formation of pixels driven by silicon thin film transistors fabricated on plastic substrates for use in active matrix displays. A pixel (or picture element) in an active matrix display consists of a silicon thin transistor (TFT) and a large electrode which may control a liquid crystal light valve, for example. The method for fabricating the pixels incorporates the prior method for forming individual silicon thin film transistors on low-temperature substrates and produces a complete pixel, and if desired an active matrix pixel array. The method of this invention enables the formation of pixels (a TFT and large electrode) on low-temperature substrate materials, such as polyethyleneterephthalate (PET) which cannot withstand process temperatures in excess of 120° C. The pixels can be fabricated and/or arranged into an array of pixels, and can be connected such that rows of pixels contain common gate electrodes of associated TFTs and/or columns of pixels which contain common drain electrodes of associated TFTs. However, the source electrode of each TFT is connected to its pixel electrode and is isolated from every other circuit element in a pixel array. Thus, the method of this invention enables the formation of an array of pixels of arbitrary number and size for controlling optically relevant materials, such as liquid crystal materials, to form an active matrix display. This invention provides an enabling technology for large area low cost electronics, such as flat panel displays, portable electronics, and toys, as well as providing displays for uses such as battlefield operation facilities; interiors of ships, tanks and aircrafts; and field-deployable portable electronics.

BRIEF DESCRIPTION OF THE DRAWINGS

The accompanying drawings, which are incorporated into and form a part of the disclosure illustrate embodiments of the invention and, together with the description, serve to explain the principles thereof.

DETAILED DESCRIPTION OF THE INVENTION

The present invention is directed to the formation of display pixels driven by silicon thin film transistors on low-temperature substrates for use in active matrix displays. The method of the present invention integrates the low temperature silicon thin film transistor (TFT) process of above-referenced application Ser. No. 08/611,318 with operational steps to produce: 1) a pixel circuit containing the TFT and an optical element, and 2) an entire array of pixels. This method allows the fabrication of TFT on low-temperature substrate materials, such as polyethyleneterephthalate (PET) which cannot withstand process temperatures in excess of 120° C. Other low-temperature plastics (processing temperatures of not greater than about 200° C.) may be used as substrates, such as polyethylenenapthalate (PEN), polyestercarbonate (PC), polyarylate (PAR), polyetherimide (PEI), polyethersulphone (PES), and polyimide (PI). A pixel (or picture element) in an active matrix display, made in accordance with the present invention, consists of a silicon thin film transistor (TFT) and a large pixel electrode electrically connected to the source electrode of the TFT. This large pixel electrode may control a liquid crystal light valve, an emissive material (such as a light emitting diode, or LED), or some other light emitting or attenuating material.

The pixels of this invention are fabricated by a method which proceeds primarily as in the method described and claimed in above-referenced application Ser. No. 08/611,318 for the formation of the silicon (Si) TFT on low-temperature plastic substrates with the addition of two (2) photolithography steps to pattern the pixel electrodes and an optional third ($3^{rd}$) photolithography step to clear the oxide over the pixel.

Figure 1:
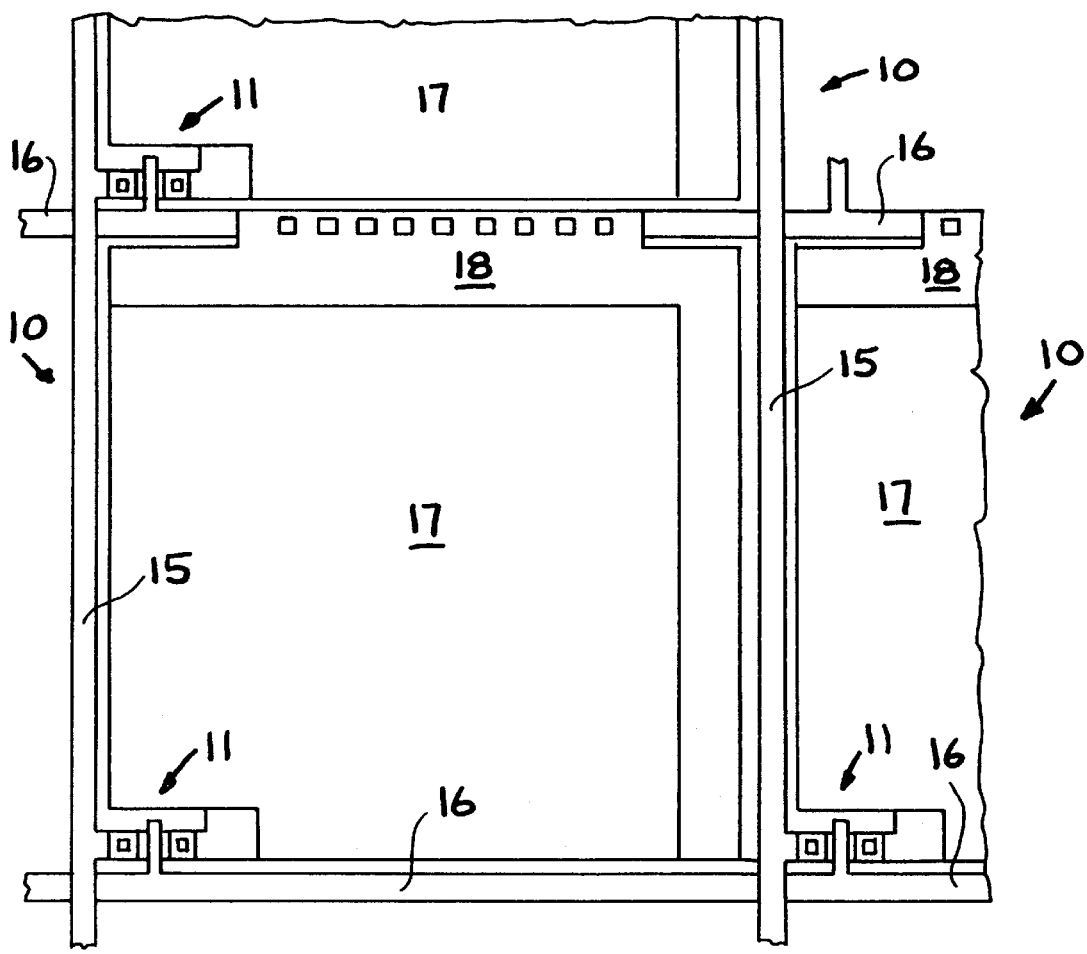
FIG. 1 is a schematic top view of a plurality of pixels for use in an active matrix display, such as displays using liquid crystal material.

An example of a layout of a plurality of pixels in an active matrix display is illustrated in FIG. 1. As shown, each pixel circuit contains a silicon TFT, a pixel electrode, typically indium doped tin oxide (ITO) for transmissive displays or aluminum (Al) for reflective displays, which is connected to the TFT source electrode, a data line which is connected to the TFT drain electrode, a scan line which is connected to the TFT gate electrode, and an optional storage capacitor operatively connected to the scan line. The pixel electrode must be electrically isolated from all other elements in the display. Plastic polyethyleneterephthalate (PET) substrates with 700 Å of ITO on the top side of the substrates are utilized in the FIG. 1 embodiment as the pixel electrodes. The ITO can be patterned either near the beginning of the process sequence, or after the TFT devices have been doped and etched and prior to interconnect metalization. In the specific method described hereinafter as an example, the ITO is patterned prior to metalization.

FIG. 1 is a top view of a plurality of pixels in an active matrix for liquid crystal display applications, each pixel showing a TFT at the bottom left, row and column ("scan" and "data") lines, a storage capacitor, and an ITO pixel electrode. The 500 µm by 500 µm pixel dimensions with 20 µm scan and data lines can be modified if desired. The pixel electrode can also be made from a reflective metal, such as aluminum, chromium, molybdenum, and titanium. In addition to ITO, the pixel electrode can be made using a coating or film of zinc oxide, aluminum doped zinc oxide (AZO), or other transparent conductors. Also, the pixel electrode in addition to being made with transparent or reflective conductors can utilize opaque or translucent conductors depending on the application for the pixels. Also, the pixel circuit can be modified by changing the size and location of the TFT, storage capacitor, and pixel electrode, along with other modifications described hereinafter.

Figure 2:
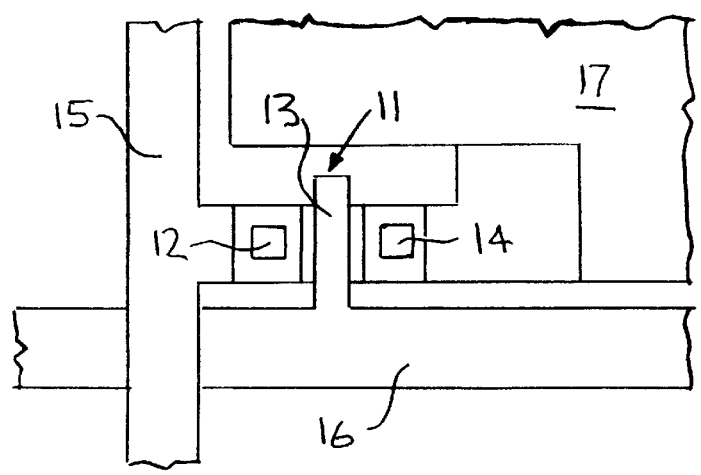
FIG. 2 is a greatly enlarged schematic view of the TFT section of a single pixel such as illustrated in FIG. 1.
Figure 3:
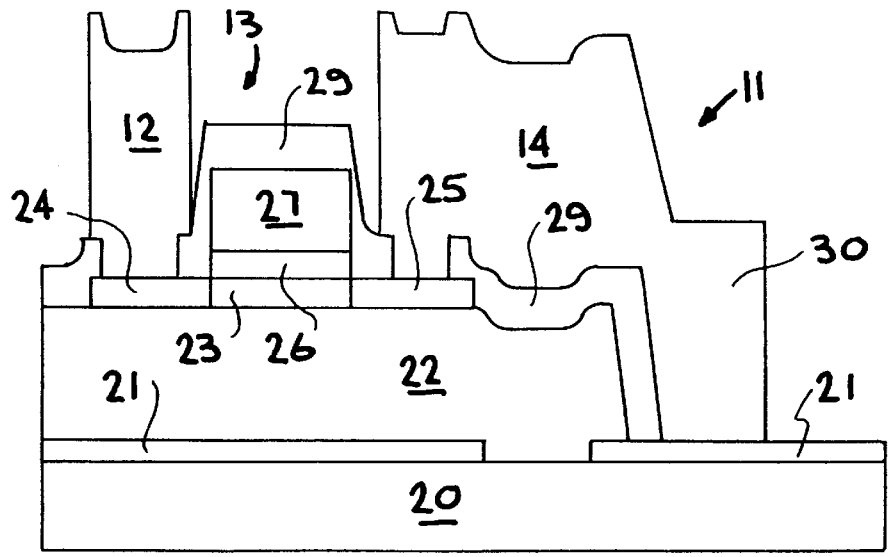
FIG. 3 illustrates an enlarged cross-section of a pixel such as illustrated in FIG. 1 (the horizontal and vertical dimension not being to scale), showing the TFT contact to the pixel electrode on a plastic substrate.

The embodiment of FIG. 1 illustrates a plurality of pixels generally indicated at 10, with only one pixel being fully illustrated in detail. It is understood that additional pixels may be located above or below and/or to the left or the right of the fully illustrated pixel to provide an array of pixels. Only two additional pixels 10 are partially shown. FIG. 2 illustrates a greatly enlarged section of the pixel 10 which contains the TFT, located in the left bottom corner of the fully illustrated pixel. Pixel 10 comprises a TFT generally indicated at 11 and including a drain electrode 12, a gate electrode 13, and a source electrode 14 (see FIG. 2) with the drain electrode 12 connected to a data line 15, the gate electrode 13 connected to a scan line 16, and the source electrode 14 connected to a pixel electrode 17. FIG. 3 illustrates a cross-sectional view of the TFT 11 and the contact to the pixel electrode on a plastic (low-temperature) substrate. An optional storage capacitor 18 is connected to scan line 16 of an adjacent pixel 10. The pixel electrode 17 must be electrically isolated from all other elements in the display. The pixel electrode 17 is, for example, composed of a polyethyleneterephthalate (PET) substrate with 700 Å of indium-doped tin oxide (ITO) on the top surface. The ITO can be patterned either near the beginning of the fabrication sequence, or after the TFT device 11 has been doped and etched, and prior to interconnect metalization, as described in greater detail hereinafter. For sake of example, the process is described wherein the ITO is patterned prior to interconnect metalization. By way of example, the pixel 10 of FIG. 1 may be of a square configuration having 500 µm sides, and with a data line width of 20 µm, but these dimensions can be modified. Also, as pointed out above, the pixel electrode 17 may be composed of a substrate with a coating of reflective metal, such as aluminum.

The pixel fabrication process, as pointed out above, proceeds primarily as described in above-referenced copending application Ser. No. 08/611,318 to make the silicon TFT devices with the addition of two (2) photolithography operations to pattern the pixel electrodes and an optional third ($3^{rd}$) photolithography step to clear the oxide over the ITO pixel electrode. The following sets forth a description of the overall process, with reference to FIG. 3:

1. Plastic substrate 20 undergoes extended bake or annealing at a temperature above 100° C. (140–150° C.) for a time period of 10 minutes to 100 hours to reduce deformation in subsequent process operations. An example of the plastic substrate 20 is the biaxially oriented semicrystalline polyester polyethyleneterephthalate (PET) which has an excellent optical quality and is low cost.

2. Solvent clean plastic substrate using a sequence of solvent or acid rinses, exemplified by:
   a) heated acetone (40–60° C. for 2–5 minutes),
   b) heated methanol (40–60° C. for 2–5 minutes),
   c) de-ionized water (DI) rinse and spin dry.

3. A 700 Å thick indium doped tin oxide (ITO) film 21 is deposited on the cleaned substrate 20 by low temperature sputtering. For reflective displays a film of aluminum, for example, is deposited on substrate 20.

4. Plasma enhanced chemical vapor deposition (PECVD) of:
   a) 5000–7500 Å of $SiO_2$ at 100° C. (not shown) on back side of substrate 20,
   b) 5000–7500 Å of $SiO_2$ at 100° C. forming layer 22 on front side of substrate 20, c) 1000 Å layer 23 of a-Si at 100° C. on SiO$_2$ layer 22.
5. Laser Crystallization of sections of the a-Si layer:
   a) front side exposure for 5–10 seconds to HF vapor (2:1 HF:DI),
   b) place plastic substrate 20 in a gas cell and pump to a pressure of <100 mTorr,
   c) irradiate the a-Si layer 23 with a pulsed excimer laser (i.e., a XeCl laser with 35 ns FWHM, λ=308 nm) with between 1 and 100 pulses of energy fluences between 80 and 500 mJ/cm$^2$, to convert all or part of layer 23 to polycrystalline silicon,
   d) remove wafer.
6. PECVD gate electrode deposition:
   a) clean laser crystallized silicon surface with a short (10–60) second dip in an oxide etchant (e.g. 777 etch made by Dodd Chemical). Rinse in deionized H$_2$O,
   b) (optional) expose substrate 20 to O$_2$ plasma for 1–5 minutes at 50–150 mTorr pressure and 50 to 250 watts to cause O$_2$ impingement on the surface,
   c) (optional) expose substrate 20 to N$_2$O before SiO$_2$ deposition,
   d) deposit layer 26 of 800–2000 Å of SiO$_2$ at 100° C. on center section of a-Si layer 23.
7. Aluminum gate electrode deposition:
   a) deposit layer 27 of 1000Å–5000 Å of 100% aluminum using either sputtering or e-beam evaporation,
   b) assure substrate 20 not heated above 100–120° C. during aluminum deposition.
8. Photolithography #1-patterning to form gate 13:
   a) the following steps are performed during each photolithography procedure and are referred to herein as "standard photolithography" steps:
      1) bake substrate 20 at 80–90° C. for 10 minutes,
      2) expose to hexamethyl disilazane (HMDS) vapor for 1–2 minutes,
      3) apply and spin photoresist to a thickness of 1–2 μm,
      4) bake substrate for 2 minutes,
      5) place substrate in photolithographic aligner system containing the appropriate mask level,
      6) expose substrate to a high intensity Hg lamp for an appropriate length of time,
      7) develop substrate to make the desired pattern in the resist layer,
      8) DI rinse and dry the substrate,
      9) inspect the resulting resist pattern, rework if necessary.
      10) bake resist at 80–90° C. for at least 10 minutes.
   b) etch the aluminum layer 27 to form the gate electrode 13.
   c) etch the exposed gate dielectric (SiO$_2$ layer 26).
   d) remove the photoresist with acetone and methanol, and rinse substrate.
   e) for additional description of the "standard photolithography" process steps, see above-referenced copending application Ser. No. 08/611,318, wherein the following process is exemplified:
      1) the thus coated plastic substrate is baked at 90° C. for 2 to 10 minutes, for example,
      2) 1.4 μm of photoresist is spun on the coated substrate with a wide range (0.5 μm to 2.5 μm) of photoresist film thicknesses being acceptable in this step,
      3) the photoresist-coated substrate is pre-baked at 90° C. for 2 minutes,
      4) the TFT gate pattern is exposed using a mask aligner,
      5) the pattern is developed using a standard resist developer,
      6) the photoresist-coated substrate is post-baked at 90° C. for 5 to 60 minutes, with 10 minutes in this example.

The gate pattern is defined using standard wet chemical and/or plasma etching techniques, an example of which follows:
   a) The exposed Al film is etched by immersion in E-6 metal etch, manufactured by Dodd Chemical, for 5 minutes or until etching is complete, leaving an area of the film, followed by a deionized water rinse. The etching time will vary with Al gate thickness and etch bath temperature (25 to 60° C.). Other wet chemical etches or dry etching processes may be substituted in this step.
   b) The sections of an oxide or insulating layer now exposed by the Al etch is removed by immersion for 30–90 seconds in a well known etchant for etching oxide over contact metal pads, such as 777 etch manufactured by Dodd Chemical, leaving an area. This etching time will vary with the oxide or insulating layer thickness. Other wet chemical etches or dry etching processes may be substituted in this step.

The remaining photoresist is removed using standard solvent and/or photoresist removal chemicals followed by rinse steps.

9. Laser doping to form the TFT source and drain regions 25 and 24:
   a) the source and drain regions are doped by a step similar to the laser crystallization step above except that the surface is irradiated in the presence of a doping gas. A gas immersion laser doping (GILD) technique known in the art can be used. Presently PF$_5$ at 200 Torr is used and each region is irradiated with 20–100 laser pulses. Other appropriate doping gases, including BF$_3$, AsF$_5$, B$_2$H$_6$ and PH$_3$ can be substituted.
   b) an alternative method of doping is to deposit a thin layer of the desired dopant using a variety of techniques, followed by laser assisted dopant drive-in. Such a technique is described and claimed in copending U.S. application Ser. No. 08/876,414, filed Jun. 6, 1997, entitled "Deposition Of Dopant Impurities And Pulsed Energy Driven-In", assigned to the same assignee. This alternative method greatly increases the efficiency of the laser doping process by reducing the number of required laser pulses to less than 5 pulses.
10. Photolithography #2-TFT II patterning:
   a) perform the above-referenced "Standard Photolithography" steps,
   b) plasma etch the silicon layer 23 in an SF$_6$ plasma for 25 seconds at 250W and 50 mTorr.
11. Photolithography #3-Pixel electrode 17 clearing:
   a) perform the "Standard Photolithography" steps,
   b) etch the SiO$_2$ layer 22 over the pixel electrode or ITO film 21 using 777 etch for about 5 minutes. The 777 etch contains 7 parts phosphoric acid, 7 parts acetic acid, 7 parts DI, and 1 part ethylene glycol.
   c) DI rinse and spin dry.
12. Photolithography #4-pixel electrode 17 isolation:
   a) perform the "Standard Photolithography" steps,
   b) etch the 700 Å ITO layer 21 to form the individual pixel electrodes 17. Etching may be accomplished using either 777 etch for 4 minutes or 2:1 DI:HCl for 75 seconds, c) DI rinse and spin dry.

13. PECVD contact isolation:
   a) perform adhesion promoting step (expose substrate to $O_2$ plasma for 2 minutes),
   b) deposit layer 29 of 1500–3500 Å of $SiO_2$, 14. Photolithography #5-Contact $SiO_2$ clearing:
   a) perform Standard Photolithography steps except add 2 minutes $O_2$ plasma exposure prior to resist spinning,
   b) etch the $SiO_2$ layer 29 in 777 etch for the appropriate duration.

15. Aluminum interconnect deposition:
   a) perform pre-sputter etch to insure contact areas have no $SiO_2$ remaining,
   b) sputter a layer 30 of 5000 Å-1 $\mu$m of 100% aluminum.

16. Photolithography #6-interconnect aluminum etching:
   a) perform "Standard Photolithography" steps,
   b) etch the aluminum layer 30 in E-6 metal etch at 40° C. for the appropriate duration.

17. Photolithography #7-pixel electrode contact $SiO_2$ clearing:
   a) perform the "Standard Photolithography" steps,
   b) etch the contact $SiO_2$ down to the ITO electrode 17. Etching is accomplished using 777 etch for 4 minutes,
   c) DI rinse and spin dry.

The storage capacitor 18 of FIG. 1 may be formed during the above described process, wherein the electrodes of the capacitor are formed by the ITO layer 21 on the bottom and interconnect metal layer 30 on top, with the contact isolation oxide layer (typically 1500 Å to 3500 Å $SiO_2$ also deposited at 100° C.) serving as the dielectric.

Variations of the above-described process include:

1. Other plastic substrate materials (either flexible or rigid) may be used as the substrate material.

2. The plastic polyethyleneterephthalate substrate can be changed to various other appropriate plastic substrates such as polyethylenenapthalate (PEN), polyestercarbonate (PC), polyarylate (PAR), polyetherimide (PEI), polyethersulphone (PES), or polyimide (PI). These substrates can be processed at higher temperatures.

3. The ITO electrode film may be deposited at a later stage in the TFT fabrication process, rather than at the beginning. Opaque, reflecting, or translucent conductors could also be used for the pixel electrode for direct view or projection displays, and may be subsequently processed to enhance the reflective or transmissive optical properties of the pixel.

4. Other gate dielectrics (such as $SiN_x$ or $TiO_2$) can be substituted for the $SiO_2$ dielectric.

5. Patterning of the pixel electrode may be performed at any appropriate step of the process.

6. Other transparent conductors (such as aluminum doped zinc oxide) may be used in place of ITO for the pixel electrode.

7. Reflective displays can be made using aluminum or some other metal as the pixel electrode. This aluminum can be either included in the interconnect metal step or at the end of the process as its own layer. If it is at the end of the process it can be placed over as much as 95% of the total pixel area (including directly over the TFT) to increase the aperture area of the pixel.

8. The simple pixel circuit shown in FIG. 1 can be modified by changing the size and location of the TFT, the storage capacitor, and the pixel electrode. Additional TFTs can be added as needed.

9. The layer thicknesses shown in FIG. 3 and described in the above description can be varied according to the desired electrical performance of the TFT and pixel circuit.

10. The simple pixel electrode and storage capacitor elements applicable for transmissive displays may be replaced with electrodes suitable for providing power to emissive materials, such as semiconductor or organic light emitting diodes (OLED's). In addition to simple electrodes, more complicated circuit elements such as a latch and power bus connection could be used to provide continuous power to light emitting materials.

11. The row and column connections for an array of pixels can be arranged so that the gate electrodes are connected together in columns, and the drain electrodes connected together into rows.

Figure 4:
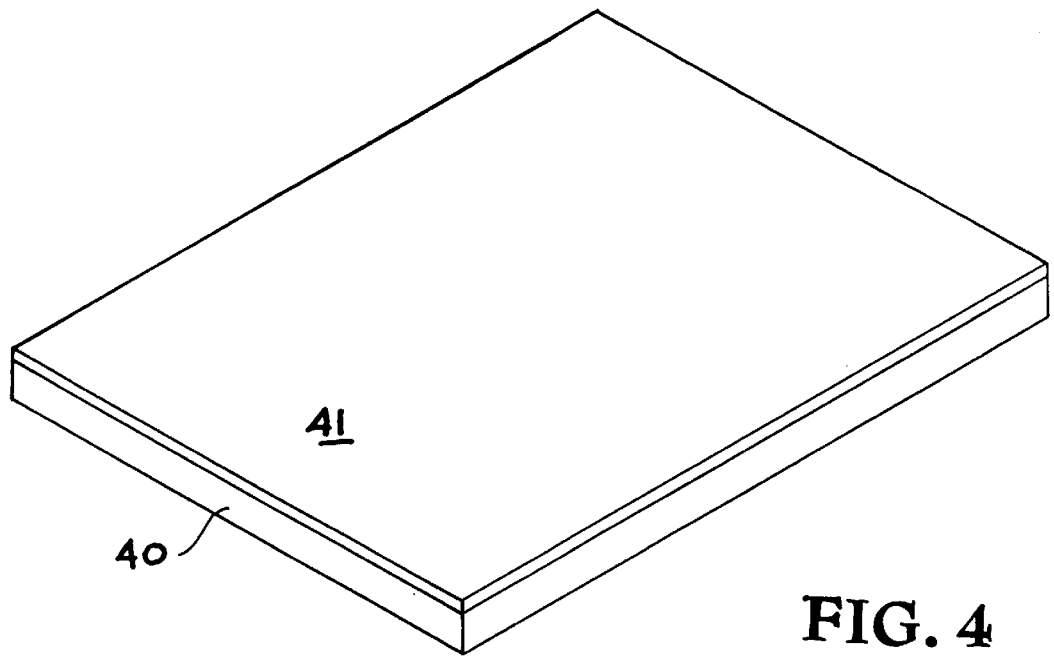
FIGS. 4–10 illustrate the fabrication of another embodiment of a pixel element.
Figure 5:
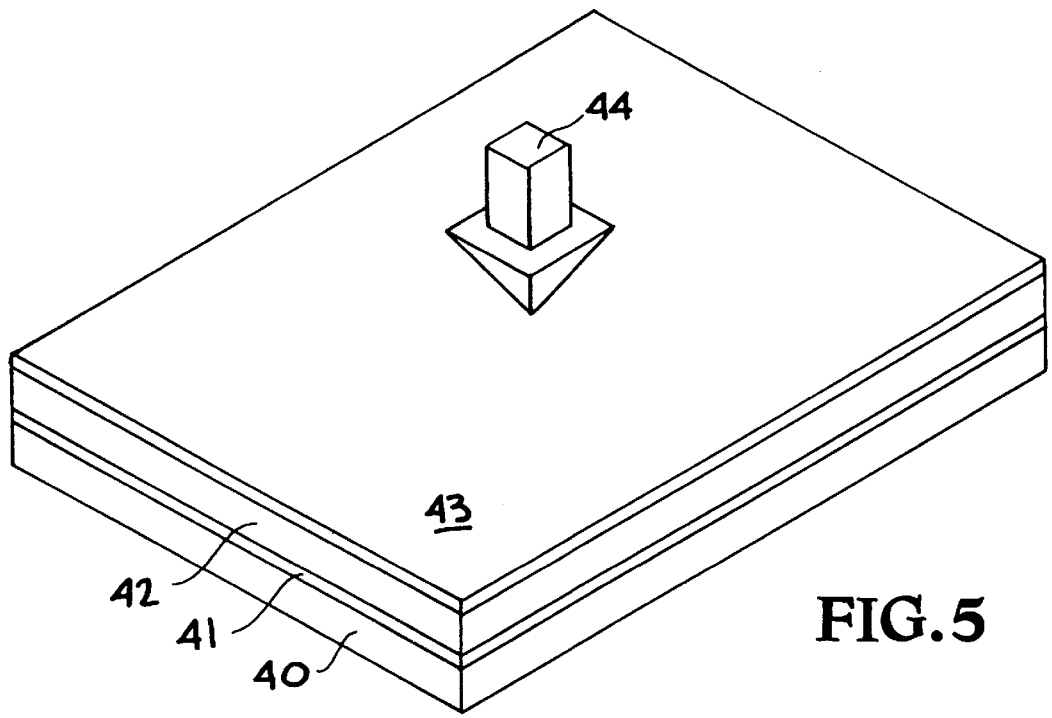
Figure 6:
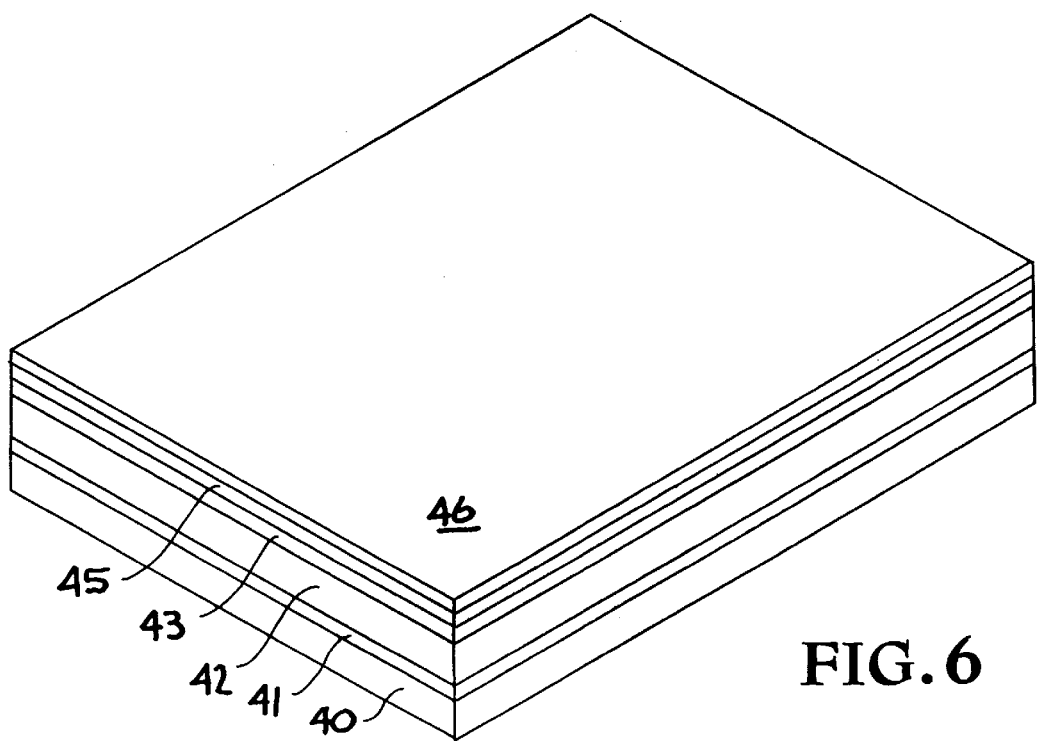
Figure 7:
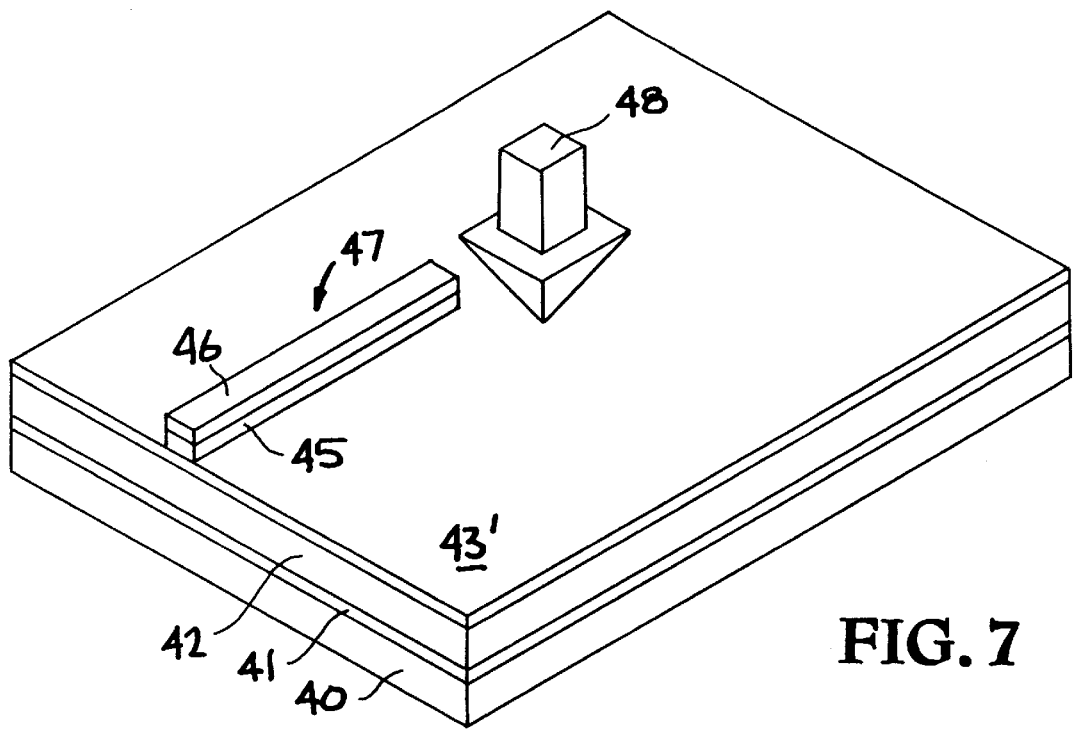
Figure 8:
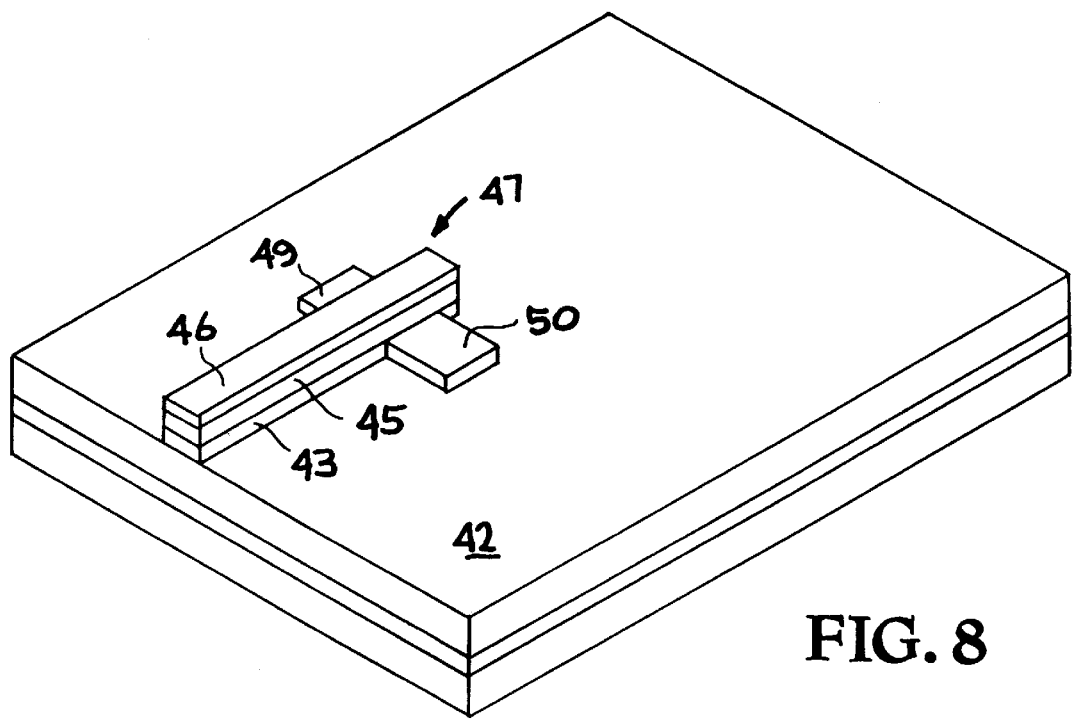
Figure 9:
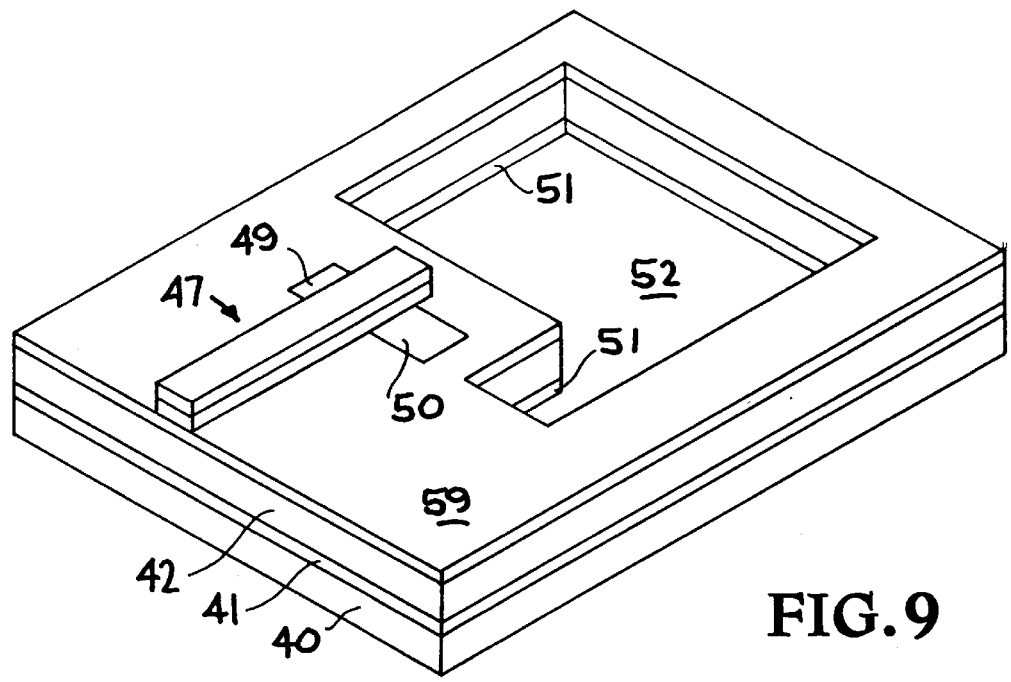
Figure 10:
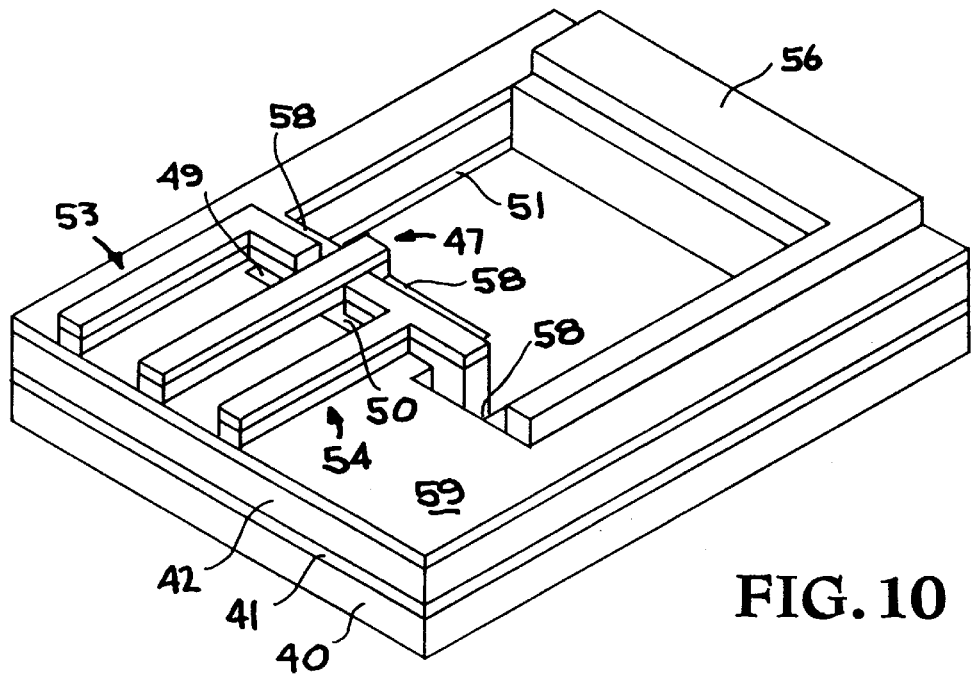

FIGS. 4–10 illustrate the fabrication of another embodiment of the pixel element, with the final product being illustrated by FIG. 10. Broadly, the embodiment of FIG. 10 is fabricated using a starting substrate composed of a layer 40 of plastic (polyester) material on which is deposited a layer 41 of ITO, as shown in FIG. 4. As shown in FIG. 5, a layer 42 of $SiO_2$ is deposited on ITO layer 41 by PECVD and a layer 43 of a-Si:H is deposited on $SiO_2$ layer 42, whereafter the a-Si:H layer 43 undergoes laser crystallization as indicated by energy flow arrows 44, the energy being produced by an XeCl pulsed excimer laser ($\lambda$=308 nm). FIG. 6 illustrates a complete device stack wherein another layer 45 of $SiO_2$ is deposited by PECVD on the crystallized a-Si:H layer 43, and a layer 46 of aluminum is deposited on the $SiO_2$ layer 45. FIG. 7 illustrates gate formation/laser doping of the device stack of FIG. 6, wherein a TFT gate electrode (scan line) 47 is formed by patterning and etching the aluminum layer 46 and the SiO2 layer 45, leaving the layer 43 exposed, and whereafter the layer 43 is irradiated by pulsed energy indicated by energy arrows 48 from an XeCl pulsed excimer laser ($\lambda$=308 nm) in a dopant atmosphere such as $PF_5$, thereby converting the undoped layer 43 to a doped poly-Si layer 43'. TFT patterning is carried out as shown in FIG. 8 wherein the doped poly-Si layer 43' is patterned and etched so as to form a TFT drain electrode 49 and a TFT source electrode 50, with the $SiO_2$ layer 42 exposed except in the location of the electrodes 47, 49 and 50. Pixel formation is then carried out as shown in FIG. 9, wherein a section of the $SiO_2$ layer 42 is patterned and etched to expose a section of the ITO layer 41 followed by patterning and etching of an outer periphery 51 of the exposed ITO layer 41 to form an ITO pixel electrode 52, with the pixel electrode 52 being electrically isolated from all other components of the pixel element. After formation of electrode 52, the entire surface is covered with a 500–3500 Å thick PECVD $SiO_2$ layer 59 (layer 29 of FIG. 3). The pixel element is completed as shown in FIG. 10 wherein contact holes 58 are formed in layer 59. A data line 53 and a source line 54 are deposited on $SiO_2$ layer 59 and in electrical contact with drain electrode 49 and source electrode 50 through contact holes 58, and with source line 54 including a contact 55 in electrical contact with ITO pixel electrode 52. Appropriate patterning of the $SiO_2$ layer 59, the gate (scan line) 47 and the ITO pixel electrode 52 is carried out to enable depositing of the data line 53, source line 54 and contact 55. A storage capacitor 56 is also deposited on $SiO_2$ layer 59 adjacent ITO pixel electrode 52 by appropriate patterning of the layer 59, etc. The end product, a pixel element, as shown in FIG. 10, can then be connected to other pixel elements via the data line, scan line, and source line, as described above.

Figure 11:
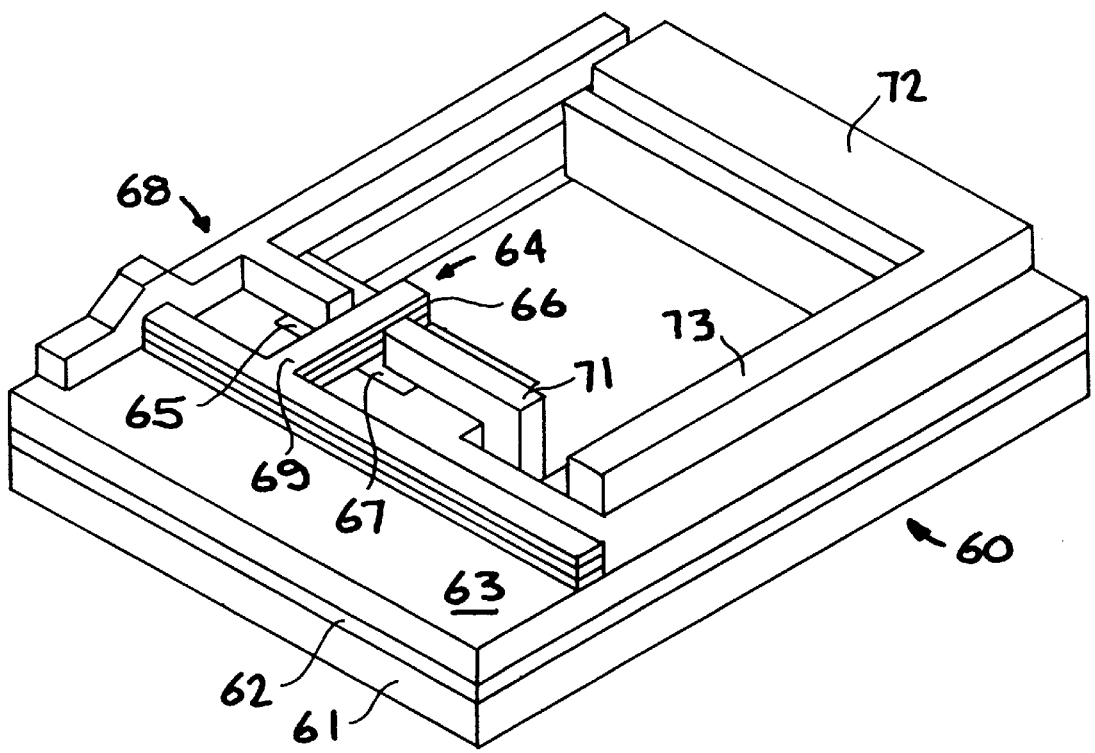
FIG. 11 is a three-dimensional illustration of another embodiment of a pixel element made in accordance with the present invention.

FIG. 11 illustrates another embodiment of a pixel element generally similar to that of FIG. 10 except in the configuration of the scan line, data line, and the contact between the source and the pixel electrode. Similar components to those of FIG. 10 are given corresponding reference numerals. In FIG. 11, the data line 53' connected to drain electrode 49 extends along the length of SiO$_2$ layer 42 and includes a raised section 57 under which the scan line (gate electrode) 47' extends. This configuration enables connection of the date line and scan line to adjacent pixel elements to form an array. The source electrode 50 is only connected to the pixel electrode 52 via a contact 55' and does not include the source line 54 as in FIG. 10. As described above, the storage capacitor 56 is adapted to be connected to the scan line 47' of an adjacent pixel element.

It has thus been shown that the present invention provides pixels driven by silicon thin film transistors fabricated on plastic substrates for use in active matrix displays, and a method of fabricating the pixels. The pixel circuit of the present invention can be arranged into an array of pixels of arbitrary number for controlling optically relevant materials (such as liquid crystal material) to form an active matrix display. The array of pixels can be connected such that rows of pixels contain common gate electrodes and columns of pixels contain common drain electrodes. The source electrode of each pixel TFT is connected only to its pixel electrode and is electrically isolated from every other circuit element in the pixel array. The pixel electrode may include transparent, opaque, reflecting, or translucent conductors for various types of displays, and may be processed to enhance the reflective or transmissive optical properties of the pixel. The present invention provides enabling technology for large area low cost electronics (such as flat panel displays), portable electronics, toys, etc., as well as applications for battlefield operations facilities, interiors of ships, tanks and aircraft, as well as field-deployable portable electronics.

While particular embodiments, materials, parameters, and processing operation sequences have been described and/or illustrated, such are not intended to be limiting. Modifications and changes may become apparent to those skilled in the art, and it is intended that the invention be limited only by the scope of the appended claims.

The invention claimed is:

1. A method for fabricating pixels for active matrix display, comprising:

providing a low temperature substrate;

forming a conductive layer on the substrate;

forming an insulative layer on the conductive layer;

forming a layer of amorphous silicon on the insulative layer;

crystallizing the amorphous silicon layer;

forming an insulation layer on the amorphous silicon layer;

forming a conductor layer on the insulation layer;

patterning and etching the conductor and insulation layers to form at least one TFT gate electrode on the amorphous silicon layer;

doping exposed areas of the amorphous silicon layer to form a doped silicon layer;

patterning and etching the doped silicon layer to form at least one TFT drain electrode and at least one TFT source electrode;

patterning and etching said insulative layer and said conductive layer to form at least one pixel electrode; and forming at least one conductor interconnecting the at least one source electrode and the at least one pixel electrode.

2. The method of claim 1, additionally including forming a data line connected to the at least one TFT drain electrode, and forming a scan line connected to the at least one TFT gate electrode.

3. The method of claim 1, additionally including forming at least one storage capacitor on the insulative layer.

4. The method of claim 1, additionally including forming the low temperature substrate from material selected from the group consisting of PET, PEN, PC, PAR, PEI, PES, and PI.

5. The method of claim 1, wherein forming the conductive layer is carried out by depositing a layer of material selected from the group consisting of transmissive and reflective materials.

6. The method of claim 1, wherein forming the conductive layer is carried out by depositing a layer of indium-doped tin oxide.

7. The method of claim 1, wherein crystallizing and doping the amorphous silicon layer is carried out using pulsed laser energy.

8. The method of claim 7, wherein doping of the amorphous silicon layer is carried out using pulsed laser energy and a dopant selected from the group consisting of PF$_5$, BF$_3$, AsF$_5$, B$_2$H$_6$, and PH$_3$.

* * * * *